United States Patent von Gentzkow et al.

[11] Patent Number: 5,919,843
[45] Date of Patent: Jul. 6, 1999

[54] EPOXY RESIN MOULDING COMPOUNDS HAVING HALOGEN-FREE FLAME RETARDATION

[75] Inventors: Wolfgang von Gentzkow, Kleinsendelbach; Klaus Kretzschmar, Erlangen; Michael Schreyer, Weisendorf; Peter Donner, Hemhofen, all of Germany

[73] Assignee: Siemens Aktiengesellschaft, Munich, Germany

[21] Appl. No.: 08/952,942

[22] PCT Filed: May 9, 1996

[86] PCT No.: PCT/DE96/00808

§ 371 Date: Nov. 21, 1997

§ 102(e) Date: Nov. 21, 1997

[87] PCT Pub. No.: WO96/37532

PCT Pub. Date: Nov. 28, 1996

[30] Foreign Application Priority Data

May 24, 1995 [DE] Germany .............. 195 19 239

[51] Int. Cl.$^6$ .............. C08K 3/32; C08L 63/02
[52] U.S. Cl. .............. 523/451; 528/51
[58] Field of Search .............. 523/451; 528/51

[56] References Cited

U.S. PATENT DOCUMENTS

| | | | |
|---|---|---|---|
| 3,634,327 | 1/1972 | Hawkins | 260/47 |
| 4,085,072 | 4/1978 | Russo | 260/2.5 |
| 4,973,631 | 11/1990 | McGrath et al. | 525/534 |
| 5,112,932 | 5/1992 | Koenig et al. | 528/51 |
| 5,496,892 | 3/1996 | Markert et al. | 525/528 |

FOREIGN PATENT DOCUMENTS

| | | |
|---|---|---|
| 4223632 | 3/1994 | Germany . |
| 1073651 | 3/1989 | Japan . |
| 2001149 | 1/1990 | Japan . |

OTHER PUBLICATIONS

Database WPI, Week 8917 (1989), Derwent Publication Ltd., London, GB; AN 89–126740, Mentioned in specification.
Database WPI, Week 9007 (1990), Derwent Publication Ltd., London, GB; AN 90–048171.
Database WPI, Week 8847 (1988), Derwent Publication Ltd., London, GB; AN 88–333625.
Database WPI, Week 7905 (1979), Derwent Publications Ltd., London, GB; AN 79–08883B.
Database WPI, Week 9121 (1991), Derwent Publications Ltd., London, GB; AN 91–152232.
Database WPI, Week 9404B (1994), Derwent Publications Ltd., London, GB; AN 94–027260, Mentioned in specification.
Kuroki, Shinichi et. al., Epoxy resin compositions with low radioactivity, American Chemical Society, 1994 (abstract), Mentioned in specification.

Primary Examiner—Melvyn I. Marquis
Assistant Examiner—D. Aylward
Attorney, Agent, or Firm—Kenyon & Kenyon

[57] ABSTRACT

Flame-resistantly formulated, flowable, latently reactive, phenolically curable epoxy-resin moulding compounds for the encapsulation of electronic components containing the following components:

an epoxy-resin component obtained from a solvent-free reaction resin mixture of polyepoxy resin and polyisocyanate resin having a molar ratio of the epoxy groups to the isocyanate groups of 1.1 to 4 at a reaction temperature of up to 220° C. in the presence of a reaction accelerator in a concentration of 0.5 to 2.5% and using triphenylphosphine oxide in a concentration of 0.05 to 10%, relative in each case to the reaction resin mixture, a hardener component containing at least two phenolic hydroxyl groups per molecule, inorganic filler, and standard additives.

13 Claims, No Drawings

EPOXY RESIN MOULDING COMPOUNDS HAVING HALOGEN-FREE FLAME RETARDATION

FIELD OF THE INVENTION

The invention relates to flame-resistantly formulated, flowable, latently reactive, phenolically curable epoxy-resin moulding compounds for the encapsulation of electronic components.

BACKGROUND OF THE INVENTION

In electronics, filler-containing moulding compounds based on epoxy resins are used for the encapsulation of active and passive components. Examples of such applications are the encapsulation of capacitors, diodes, transistors, power semiconductors, optocouplers, memory chips and microprocessors. Suitable epoxy-resin moulding, compounds for this purpose must fulfil high requirements relating to the processing and moulded-material properties. This relates, in particular, to the purity of the moulding compounds and also to the rheological behaviour and the curing properties during processing as transfer moulding compounds by means of transfer moulding processes and, furthermore, to the mechano-thermal properties of the epoxy-resin moulded materials and to the stable long-term protection of the components against aggressive environmental influences. In addition, the epoxy-resin moulded materials must fulfil the high requirements of electronics relating to the flame-resistant behaviour and achieve the classification V-0 for a layer thickness of $\leq 1.6$ mm in the internationally standard flammability test according to UL 94 V.

The curing of epoxy-resin moulding compounds can in principle be carried out with chemically varied hardener components, for example with carboxylic anhydrides, amines or phenols. However, phenolically curable epoxy-resin transfer moulding compounds heavily filled with synthetic silica flour have gained acceptance for the encapsulation of electronic components by means of transfer moulding processes.

The phenolically curable epoxy-resin transfer moulding compounds at present used industrially contain, as a rule, 10 to 30% of organic components and 70 to 90% of inorganic components. In most cases, the chemical basis of the resin components is composed of cresol-novolak epoxy resins. Phenol novolaks are predominantly used to cure the epoxy resins; the reaction is accelerated, for example, with triphenylphosphine, phenylphosphonium borate and 2-ethyl-4-methylimidazole. Silicone-modified epoxy-resin components are used in the moulding compounds to improve the low-stress behaviour (in this connection, see German Offenlegungsschrift 42 23 632).

The flame-resistant formulation of the compression-moulding compounds is carried out using aromatic bromine compounds, in particular with tetra-bromobisphenol A epoxy resins, which are chemically incorporated in the epoxy-resin moulded material during curing. In addition, antimony trioxide increases the effectiveness of the brominated flame retardants as a synergist. The flame-resistant properties of the epoxy-resin moulded materials are further promoted by a high content of silanized synthetic silica fillers; in this connection, both splintery fillers and mixtures of splintery and spherical fillers are used. Recently, synthetically produced α-radiation-free synthetic silica fillers have been used to avoid so-called soft errors in large-scale-integrated circuits. The high content of silanized synthetic silica filler also serves to improve the mechano-thermal properties of the epoxy-resin moulded materials, in particular to adjust the coefficients of expansion. The compression-moulding compounds also contain, in addition, small amounts of additives, in particular soot, and processing aids, such as stearates and waxes.

To produce the phenolically curable epoxy-resin transfer moulding compounds, the resin and hardener components are converted into a pre-reacted state (B stage) and pulverized, as a rule, at temperatures up to approximately 120° C., in particular by kneading on a roll mill or by extrusion, for example by means of a screw compounder. To process the transfer moulding compounds by means of transfer moulding processes, the moulding-compound powder is generally pelletized and, if necessary, the pellets are pre-heated to 70 to 90° C. before processing. The components are generally encapsulated at moulding temperatures from 170 to 190° C. and a pressure of 70 to 200 bars, the compression-moulding compound being cured in the mould generally for 60 to 120 s. The components are then demoulded and, if necessary, postcured at temperatures from 170 to 190° C.

Although the phenolically curable epoxy-resin moulding compounds which have been flame-resistantly formulated with bromine-containing flame retardants and antimony trioxide and which have outstanding flame-retarding properties have proved advantageous in electronics, their use is not, however, without problems. In particular, during fire and carbonization, they form highly corrosive bromine compounds, such as hydrogen bromide, and aromatic bromine compounds which are biologically difficult to degrade, such as polybromodibenzodioxins and polybromodibenzofurans. In addition, epoxy-resin moulded materials containing brominated flame retardants are unsuitable for recycling if a further scattering of dangerous products is to be avoided. In addition, the disposal of such epoxy-resin moulded materials as waste by combustion can be carried out in future only as hazardous waste by means of industrially expensive and economically unprofitable combustion processes because of the ever-increasing requirements relating to air-pollution prevention. One objection to the use of antimony trioxide is that this compound is on the list of carcinogenic hazardous substances. Although the risk is negligible in the case of permanent incorporation, as exists in the cured compression-moulding compound, expensive protective measures relating to health and safety at work are however necessary for the production of antimony-trioxide-containing compression-moulding compounds. In addition, antimony trioxide which is released during the processing, i.e. during the encapsulation of electronic components, and also in the event of fire or carbonization or during recycling processes represents a high risk in the form of inhalable dust.

Work has also already been carried out on the flame-resistant formulation of compression-moulding compounds without the use of halogen-containing flame retardants. For this purpose, German Offenlegungsschrift 42 23 632 discloses a latently reactive, phenolically curable epoxy-resin moulding compound without halogen-containing flame retardation, in whose production the following procedure is adopted. First of all, an isocyanate-group-free, latently reactive prepolymeric epoxy-resin mixture is produced in powdered form from a filler-containing, thermally polymerizable reaction resin mixture of polyepoxy resin EP (mixture of difunctional and multifunctional epoxy resins) and polyisocyanate resin IC (EP:IC molar ratio >1) using substituted imidazole as a reaction accelerator (concentration: 0.5 to 2.5%, relative to EP) at reaction temperatures up to 200° C.

Said epoxy-resin mixture is then mixed with a powdered, filler-containing phenolic-resin mixture (molar ratio of epoxy groups to phenolic hydroxyl groups: 1:0.4 to 1:1.1), optionally with the addition of additives.

A disadvantage of this process is that, in the production of the prepolymeric epoxy-resin mixture, which is carried out, for example, by means of a continuously running reactor (in this connection, see German Offenlegungsschrift 42 23 622), high contents of filler are necessary in order to "dilute" the reaction resin mixture, i.e. to reduce its reactivity and to be able to remove the heat of reaction released during the reaction of the polyepoxy resin with the polyisocyanate resin sufficiently quickly. In particular, without the presence of filler, the development of large amounts of heat which sets in spontaneously results in the decomposition of the material. The high filler content, however, considerably limits the breadth of variation in the industrial production of the prepolymeric epoxy-resin mixture and, consequently, also of the epoxy-resin moulding compound, since any adaptation of the formulation to the processing and moulded material properties already has to be established in compounding the reaction resin mixture (of polyepoxy resin and polyisocyanate resin). In that case, however, a quick and flexible adaptation to the particular application purpose of the moulded materials is impossible.

SUMMARY OF THE INVENTION

The object of the invention is to provide inexpensively accessible epoxy-resin moulding compounds containing an epoxy-resin component and a hardener component which can be processed comparably with the epoxy-resin compression-moulding compounds used industrially, are suitable for the encapsulation of electronic components and which yield low-flammability moulded materials, i.e. moulded materials which can be classified V-0 according to UL 94, without antimony trioxide and/or halogen compounds, the epoxy-resin component having to be obtainable economically from polyepoxy resin and polyisocyanate resin without adding filler.

According to the invention, this is achieved in that the epoxy-resin moulding compounds contain the following components:

an epoxy-resin component obtained from a solvent-free reaction resin mixture of polyepoxy resin and polyisocyanate resin having a molar ratio of the epoxy groups to the isocyanate groups of 1.1:1 to 4:1 at a reaction temperature of up to 220° C. in the presence of a reaction accelerator in a concentration of 0.5 to 2.5% and using triphenylphosphine oxide in a concentration of 0.05 to 10%, relative in each case to the reaction resin mixture, a hardener component containing at least two phenolic hydroxyl groups per molecule, inorganic filler, and standard additives.

DETAILED DESCRIPTION OF THE INVENTION

In particular, it was found, surprisingly, that the chemical reaction of the reaction resin mixture, i.e. the mixture of polyepoxy resin with polyisocyanate resin, which takes place when a reaction accelerator is used, is delayed in the presence of triphenylphosphine oxide and is consequently controllable. This means, however, that said reaction can also be carried out successfully in the absence of filler (and without solvent). In addition, the property spectrum of moulded materials obtained from phenolically cured epoxy moulding compounds which contain an epoxy-resin component of the said type and in which the filler is added only during the final formulation is not impaired by the addition of triphenylphosphine oxide.

True, it has already been proposed to use triphenylphosphine oxide as an additive for the flame-resistant formulation of compression-moulding compounds based on phenolically curable cresol-novolak epoxy resins. The action of triphenylphosphine oxide as sole flame retardant is, however, apparently very small. In particular, either very high concentrations of triphenylphosphine oxide are needed, for example 8 parts by mass of triphenylphosphine oxide in 110 parts by mass of compression-moulding compound, equivalent to approximately 7.2% (published Japanese Patent Application 61-127748), or the triphenylphosphine oxide has to be combined with a hydrated metal oxide, such as antimony pentoxide hydrate as synergist (published Japanese Patent Application 01-073651). In addition, an accelerating effect on the crosslinking of epoxy resins with phenolic resins is ascribed to the triphenylphosphine oxide (published Japanese Patent Application 01-073651).

WO 90/15089 discloses epoxy-terminated polyoxazolidinones (referred to therein in simplified form as polyoxazolidones) which are produced, without high filler concentrations, from reaction resin mixtures of polyepoxy resins and polyisocyanate resins at temperatures between 110 and 200® C.; in this process, the polyisocyanate resin is added to the accelerator-containing polyepoxy resin. However, in a process of this type, a continuous procedure is impossible, and in addition, the low accelerator concentrations (between 0.01 and 2%, relative to the mixture of polyepoxy resin and polyisocyanate resin) used require very long and, consequently, uneconomical reaction times. At high accelerator concentrations and at the high temperatures necessary for the reaction, on the other hand, the polyepoxy resin crosslinks to form an insoluble, infusible and, consequently, unusable product even before and during the addition of the polyisocyanate resin. The epoxy-terminated polyoxazolidinones obtained in the way mentioned serve, as epoxy-resin components, solely to produce prepregs and laminates from solvent-containing mixtures containing aminic or phenolic hardener components. Tetrabromobisphenol A is used for the flame-resistant formulation.

The epoxy-resin component of the epoxy-resin moulding compounds according to the invention is, or contains, a prepolymer having nitrogen-heterocyclic oxazolidinone and isocyanurate structures. The use of triphenylphosphine oxide in epoxy-resin components or moulding compounds of this type has, however, hitherto not been disclosed. The content of triphenylphosphine oxide in the moulding compounds is 0.01 to 2.3%, preferably 0.5 to 1.2%.

In the production of the epoxy-resin component (from the reaction resin mixture of polyepoxy resin and polyisocyanate resin), the concentration of triphenylphosphine oxide is 0.05 to 10%, preferably 2 to 5%. The polyepoxy resin is advantageously a difunctional epoxy resin. The molar ratio of the epoxy groups to the isocyanate groups is 1.1 to 4, preferably 1.8 to 3.

The epoxy-resin component can be produced in portions in duplex kneaders or, particularly advantageously, continuously in suitably designed reaction extruders. Prior to further processing, the epoxy-resin component is pulverized. Advantageously, said component may also contain in addition solid, powdered epoxy resin, preferably of up to 20% by mass.

To produce the epoxy-resin moulding compounds, a phenolic hardener component is added to the epoxy-resin component. In this mixture, the ratio of the phenolic hydroxyl groups to the epoxy groups is advantageously 0.5 to 1.1 and, preferably, 0.7 to 0.9. The epoxy-resin moulding compounds furthermore contain inorganic filler and standard additives. The content by mass of inorganic filler is generally 60 to 90%, preferably 70 to 85%. The additives, such as mould release agents and processing aids, are added in the standard, low concentrations. The addition of a curing accelerator is generally unnecessary since the reaction accelerator contained in the epoxy-resin component is also active during curing and, consequently, is able to serve as curing accelerator in the moulding compound.

Suitable as polyepoxy resin are, in particular, difunctional epoxy resins, such as bisphenol A epoxy resins and bisphenol F epoxy resins, biphenyl bisglycidyl resins, naphthyl bisglycidyl resins and bisglycidyl hexahydrophthalate. Furthermore, higher functional epoxy resins, such as cresol-novolak and phenol-novolak epoxy resins, and also epoxy resins based on tetraglycidyldiaminodiphenylmethane, triglycidylisocyanurate, polyglycidyldinaphthylmethane and triglycidyltriphenylmethane can be used. With the aid of these epoxy resins, it is possible, in particular, to raise the glass transition temperature of the moulded materials. The difunctional epoxy resins may be used individually or in the form of mixtures, it being possible for modified silicone epoxy resins to be used in mixtures even having isocyanurate structures (in this connection, see: European Patent Specification 0 399 199). The difunctional epoxy resins or suitable mixtures can furthermore be used together with higher functional epoxy resins.

Suitable as polyisocyanate resin are, in particular, diisocyanatodiphenylmethane, toluylene diisocyanate and naphthylene diisocyanate, and also their isomeric mixtures and polymeric isomeric mixtures of diisocyanatodiphenylmethane. Furthermore, trimeric toluylene diisocyanate is suitable as polyisocyanate resin.

Preferably, 1,8-diazabicyclo[5.4.0]undec-7-ene (DBU) and substituted imidazoles, in particular 1-methylimidazole, 2-methylimidazole, 2-phenylimidazole, 2-ethyl-4-methylimidazole, 1-benzyl-2-phenylimidazole and 1-cyanoethyl-2-phenylimidazole serve as reaction accelerator. Furthermore, substituted phosphines, such as triphenylphosphine and tertiary amines, such as 1,4-diazabicyclo[2.2.2]octane (DABCO) are suitable.

Suitable as hardener component containing at least two phenolic hydroxyl groups per molecule are, in particular, phenol novolaks, cresol novolaks, biphenylols and alkylphenol-modified silicones or mixtures thereof.

Preferably, mineral synthetic silica, in particular with splintery and/or spherical particle shape of various particle size distributions, serves as filler. Also suitable are thorium-free and uranium-free synthetic silica flours, and also wollastonite. However, ceramic fillers, such as aluminium oxide and fibrous fillers, such as short glass fibres, can also be used. The fillers can be used individually or in mixtures.

Standard processing aids, such as internal mould release agents, for example montan wax, micronized polyethylenes, carnauba wax and metal salts of stearic acid, and pigments for colouring the materials, for example soot or titanium dioxide, are used as additives.

The epoxy-resin moulding compounds according to the invention (having halogen-free flame retardation) are prepared by mixing the powdered components in suitable mixing devices, in accordance with the formula proportions. The mixtures are then homogenized in the molten state of the resin component and hardener component to form the epoxy-resin moulding compound in a further processing step on a roll mill or by extrusion, for example using a co-rotating twin-screw compounder, and then pulverized and pelletized by standard methods. Electronic components are encapsulated using the transfer moulding process, adapted to the respective technology, in the temperature range between 170 and 190° C. with an injection time and curing time in the mould of 60 to 180 s.

The invention will be explained in still greater detail by reference to exemplary embodiments.

EXAMPLES 1 TO 8

Production of prepolymeric epoxy-resin components

The polyepoxy resin or polyepoxy-resin mixture specified in Table 1 is melted and introduced into the trough of a duplex kneader having low-wear kneader blades. The parts by mass specified in Table 1 of reaction accelerator, triphenylphosphine oxide and, optionally, additive (montan wax) are subsequently added and then mixed at room temperature. The parts by mass of polyisocyanate resin specified in Table 1 are added to this mixture and mixed in for 5 min at room temperature, then the mixture is heated. This is done by means of the heating jacket of the duplex kneader into which a heat transfer medium pre-heated to 225° C. in a thermostat is pumped via a three-way valve. The compound becomes solid within 45 to 75 s and then melts again after approximately 10 min. Throughout the entire reaction time, the compound is agitated by the kneader blades. Once the compound has melted again, the heating circuit is disconnected and the trough is emptied onto a cooled aluminium sheet. The prepolymeric epoxy-resin component obtained in this process is then ground to powder for further processing. The epoxy value, determined after adding 2-butanone/HCl by potentiometric back-titration in accordance with DIN 16 945 (see Table 1) serves as characteristic value of the prepolymeric epoxy-resin component. The prepolymeric epoxy-resin component is stored at room temperature with the exclusion of moisture.

EXAMPLES 9 AND 10

Production of prepolymeric epoxy-resin components by reaction extrusion

The production is carried out in all cases using 60 times the quantity (in grams) of the parts by mass of the individual components specified in Table 1. For this purpose, polyepoxy resin is mixed in a temperature-controllable and evacuable mixing container and the mixture is then heated to 120° C. while stirring at reduced pressure. Triphenylphosphine oxide is then added to the mixture in portions while stirring. Once the triphenylphosphine oxide has completely dissolved, the mixture is cooled to 25° C. and simultaneously degassed under reduced pressure (<1 mbar). The reaction accelerator is introduced into the cold compound. After homogenization, the mixture is fed at 25° C. to a co-rotating twin-screw compounder by a gear pump having a continuous material flow of 2.6 kg/h. Simultaneously, 0.65 kg/h of polyisocyanate resin (Example 9) or 0.705 kg/h (Example 10), respectively, are dispensed into the twin-screw compounder using a systolic pump. The screws of the compounder are constructed exclusively from conveyor components. The screw length is 1080 mm and the outer screw diameter is 31.8 mm; the seven cylindrical zones of the compounder are heated to 200° C. The screw rotary speed is 20 min$^{-1}$ which results in a material dwell time in the twin-screw compounder of 3 min.

The extrudate is discharged at a material temperature of 190° C., cooled to 50° C. by direct contact with a cooled slide plate and pelletized by a counter-roll on an adjoining elastic take-off belt. The compound produced in this process is then ground and sifted at room temperature to a particle size of <200 μm by means of a fine impact grinder having grinding face and screen insert. The flowable, latently reactive, curable prepolymeric epoxy-resin component obtained is stored at room temperature with the exclusion of moisture. The epoxy value of the epoxy-resin components is cited in Table 1.

EXAMPLES 11 TO 19
Production of epoxy-resin moulding compounds (epoxy-resin compression-moulding compounds)

The corresponding amounts of pulverized hardener component, filler and additive (soot), relative to the parts by mass of the epoxy-resin component (EP component) specified in Table 2, are added in each case to 120 g of the prepolymeric epoxy-resin components 1 to 7, 9 and 10 in a truncated-cone mixer. Vigorous mixing is then carried out for 30 min and the mixture obtained is homogenized within 2 to 3 min to form the epoxy-resin moulding compound on a roll mill at temperatures between 80 and 100° C., while melting takes place. The cooled material is comminuted and pressed to form pellets having a mass of 60 g. The content of triphenylphosphine oxide or phosphorus in the moulding compounds is to be found in Table 2.

EXAMPLE 20
Production of an epoxy-resin moulding compound (epoxy-resin compression-moulding compound)

An additional epoxy resin (20.4 g), pulverized hardener (43.3 g), filler (300.8 g+128.9 g) and additive (6.2 g of soot and 3.1 g of montan wax) are added to 120 g of the prepolymeric epoxy-resin component 8 in a truncated-cone mixer. Vigorous mixing is then carried out for 30 min and the mixture obtained is homogenized within 2 to 3 min to form the epoxy-resin moulding compound on a roll mill at temperatures between 80 and 100° C., while melting takes place. The cooled mass is comminuted and pressed to form pellets having a mass of 60 g. The content of triphenylphosphine oxide or phosphorus in the moulding compound is to be found in Table 2.

EXAMPLES 21 TO 27
Production of moulded-material test pieces

The pelletized epoxy-resin moulding compounds 11, 13, 15 to 18 and 20 are processed to form moulded-material panels of dimensions 150×90×1.6 mm³ using the transfer moulding process. For this purpose, the epoxy-resin moulding compound pre-heated to 90° C. by means of high-frequency heating is injected in each case into the mould heated to 175° C. at a pressure of 100 bars. The mould closing time (injection time and curing time in the mould) is 90 s. The panels are then post-cured for 4 h at 190° C. The test pieces required for the material tests are cut out of the moulded-material panels using a diamond-impregnated wire saw.

The processing properties of the epoxy-resin moulding compounds and essential material properties of the epoxy-resin moulded materials are listed in Table 3. The viscosity of the epoxy-resin moulding compounds is determined at 175° C. using a cone-and-plate device (Rotovisko, supplied by the Haake company). As a measure of the reactivity of the moulding compounds or compression-moulding compounds, the time is determined which is necessary to achieve a viscosity increase to 500 Pa•s at 175° C. Immediately after demoulding, the Shore D hardness (DIN 53 505) is measured of the moulded-material panels at a temperature of 175° C. To determine the flame resistance, the flammability test is carried out in accordance with UL 94 V on test pieces with a layer thickness of 1.6 mm. The glass transition temperature ($T_G$) of the moulded materials is determined by means of thermomechanical analysis, and the linear coefficients of thermal expansion ($\alpha_1$ and $\alpha_2$) below and above the glass transition temperature, respectively, are determined in the same way.

EXAMPLE 28

Encapsulation of electronic components

To encapsulate electronic components in the form of integrated circuits mounted on lead frames, the epoxy-resin moulding compounds are pressed to form pellets having a diameter of 50 mm and a mass of 50 g under a pressure of 6 to 10 t/cm². The pellets are pre-heated to 90° C. using high-frequency heating and then injected into a mould, pre-heated to 180° C. for P-DIP-14 packages (plastic dual in-line package) into which a lead-frame strip with seven mounted integrated circuits has been inserted; the injection pressure is 70 bars and the injection time and the curing time in the mould is 120 s. The encapsulated components are then removed from the mould and postcured for 4 h at 190° C. The components are subsequently separated and the standard further process steps of final mounting are then carried out. Incidentally, no external mould release agent is used in the encapsulation of the electronic components.

Key to the tables

Polyepoxy resin
    EP 1: Bisphenol A bisglycidyl ether, epoxy value: 5.78 mol/kg
    EP 2: Bisphenol F bisglycidyl ether, epoxy value: 6.18 mol/kg
    EP 3: Tetraglycidyldiaminodiphenylmethane, epoxy value: 8.76 mol/kg
    EP 4: Biphenyl glycidyl resin, epoxy value: 5.30 mol/kg
    EP 5: Silicone epoxy resin, epoxy value: 1.50 mol/kg Polyisocyanate resin
    IC 1: Diphenylmethane diisocyanate (isomeric mixture), isocyanate value: 8.00 mol/kg
    IC 2: Toluylene diisocyanate (isomeric mixture), isocyanate value: 11.50 mol/kg Hardener
    H 1: Cresol novolak, hydroxyl value: 7.95 mol/kg
    H 2: Phenol novolak, hydroxyl value: 8.90 mol/kg Reaction accelerator
    RB 1: 2-phenylimidazole
    RB 2: 1,8-diazabicyclo[5.4.0]undec-7-ene (DBU)

Filler
    F 1: Synthetic silica, spherical
    F 2: Synthetic silica, splintery

TABLE 1

Composition of halogen-free, flame-resistantly formulated, prepolymeric epoxy-resin components (parts by mass)

| Example | 1 | 2 | 3 | 4 | 5 | 6 | 7 | 8 | 9 | 10 |
|---|---|---|---|---|---|---|---|---|---|---|
| EP 1 | 55.96 | 55.32 | 53.73 | 50.80 | 71.50 | — | 3.72 | — | 3.50 | 3.00 |
| EP 2 | — | — | — | — | 4.00 | 70.88 | 70.78 | — | 70.00 | 64.00 |
| EP 3 | 18.75 | 18.53 | 18.00 | 17.01 | — | — | — | — | — | — |
| EP 4 | — | — | — | — | — | — | — | 82.00 | — | — |
| EP 5 | 1.50 | 1.50 | 1.50 | 1.50 | — | — | — | — | — | — |
| IC 1 | 20.58 | 20.35 | 19.77 | 18.69 | — | — | — | — | — | 27.00 |
| IC 2 | — | — | — | — | 19.00 | 19.12 | 20.00 | 15.20 | 20.00 | — |
| RB 1 | 1.00 | 1.50 | 1.50 | 2.00 | — | — | — | 1.00 | — | — |
| RB 2 | — | — | — | — | 1.00 | 1.00 | 1.00 | — | 1.00 | 1.00 |
| TPPO *) | 1.21 | 1.80 | 4.50 | 9.00 | 4.50 | 9.00 | 4.50 | 1.80 | 5.50 | 5.00 |
| Montan wax | 1.00 | 1.00 | 1.00 | 1.00 | — | — | — | — | — | — |
| Epoxy value **) | 2.79 | 2.91 | 2.58 | 2.58 | 1.76 | 2.35 | 2.26 | 2.68 | 1.90 | 1.50 |

*) Triphenylphosphine oxide
**) Epoxy value of the prepolymeric epoxy-resin component in mol/kg

TABLE 2

Composition of halogen-free, flame-resistantly formulated epoxy-resin moulding compounds (parts by mass)

| Example | 11 | 12 | 13 | 14 | 15 | 16 | 17 | 18 | 19 | 20 |
|---|---|---|---|---|---|---|---|---|---|---|
| EP component | 1 | 2 | 3 | 4 | 5 | 6 | 7 | 9 | 10 | 8 |
|  | 23.42 | 23.22 | 23.81 | 23.72 | 25.90 | 24.77 | 24.94 | 26.17 | 26.00 | 19.27 |
| Epoxy resin *) | — | — | — | — | — | — | — | — | — | 3.28 |
| H 1 | 6.58 | 6.78 | 6.19 | 6.18 | — | — | — | — | 4.00 | 6.95 |
| H 2 | — | — | — | — | 4.10 | 5.23 | 5.06 | 3.83 | — | — |
| F 1 | 48.30 | 48.30 | 48.30 | 48.30 | 48.30 | 48.30 | 48.30 | 48.30 | 48.30 | 48.30 |
| F 2 | 20.70 | 20.70 | 20.70 | 20.70 | 20.70 | 20.70 | 20.70 | 20.70 | 20.70 | 20.70 |
| Soot | 1.00 | 1.00 | 1.00 | 1.00 | 1.00 | 1.00 | 1.00 | 1.00 | 1.00 | 1.00 |
| Montan wax | — | — | — | — | — | — | — | — | — | 0.50 |
| TPPO content **) | 0.28 | 0.42 | 1.07 | 2.13 | 1.11 | 2.23 | 1.12 | 1.44 | 1.30 | 0.35 |
| P content ***) | 0.03 | 0.05 | 0.12 | 0.24 | 0.13 | 0.25 | 0.13 | 0.16 | 0.14 | 0.04 |

*) Naphthyl glycidyl resin (epoxy value: 5.93 mol/kg)
**) Triphenylphosphine oxide content of moulding compound in %
***) Phosphorus content of the moulding compound in %

TABLE 3

Processing properties of epoxy-resin moulding compounds and material properties of halogen-free, flame-resistant epoxy-resin moulded materials

| Example | 21 | 22 | 23 | 24 | 25 | 26 | 27 |
|---|---|---|---|---|---|---|---|
| Epoxy-resin moulding compound | 11 | 13 | 15 | 16 | 17 | 18 | 20 |
| Processing properties | | | | | | | |
| Viscosity (at 175° C.) in Pa · s | 130 | 145 | ·/. | ·/. | ·/. | 150 | ·/. |
| Reactivity (at 175° C.) in s | 32 | 25 | ·/. | ·/. | ·/. | 55 | ·/. |
| Shore D hardness (on demoulding) | 82 | 80 | 68 | 58 | 68 | 55 | 85 |
| Material properties | | | | | | | |
| Flame-resistance classification according to UL 94/1.6 mm | V-O | V-O | V-O | V-O | V-O | V-O | V-O |
| Sum of burning times in s *) | 28 | 18 | 0 | 2 | 0 | 0 | 40 |
| Glass transition temperature [° C.] | 157 | 140 | 142 | 123 | 127 | 127 | 176 |
| Linear coefficient of thermal expansion $\alpha_1$ [$10^{-6}$/K] | 19 | 19 | 20 | 20 | 19 | 19 | 20 |
| Linear coefficient of thermal expansion $\alpha_2$ [$10^{-6}$/K] | 69 | 72 | 72 | 66 | 68 | 67 | 72 |

·/. = value was not determined
*) 10 flame treatments for 10 s each time

What is claimed is:

1. A flame-resistant, flowable, latently reactive, phenolically curable epoxy-resin moulding compound for the encapsulation of electronic components, comprising: an epoxy-resin component obtained from a solvent-free reaction resin mixture of polyepoxy resin and polyisocyanate resin having a molar ratio of the epoxy groups to the isocyanate groups of 1.1:1 to 4:1 at a reaction temperature of up to 220° C. in the presence of a reaction accelerator in a concentration of 0.5 to 2.5% and using triphenylphosphine oxide in a concentration of 0.05 to 10%, relative in each case to the reaction resin mixture, a hardener component containing at least two phenolic hydroxyl groups per molecule, inorganic filler, and additives.

2. The epoxy-resin moulding compound according to claim 1, wherein the polyepoxy resin is a difunctional epoxy resin.

3. The epoxy-resin moulding compound according to claim 1, wherein the concentration of triphenylphosphine oxide, relative to the reaction resin mixture, is 2 to 5%.

4. The epoxy-resin moulding compound according to claim 1, wherein the epoxy-resin component additionally contains a solid epoxy resin.

5. The epoxy-resin moulding compound according to claim 4, wherein the solid epoxy resin is up to 20% of the epoxy-resin component.

6. The epoxy-resin moulding compound according to claim 1, wherein the molar ratio of the epoxy groups to the isocyanate groups is 1.8:1 to 3:1.

7. The epoxy-resin moulding compound according to claim 1, wherein the molar ratio of the phenolic hydroxyl groups of the hardener component to the epoxy groups of the epoxy-resin component is 0.5:1 to 1.1:1.

8. The epoxy-resin moulding compound according to claim 1, wherein the molar ratio of the phenolic hydroxyl groups of the hardener component to the epoxy groups of the epoxy-resin component is 0.7:1 to 0.9:1.

9. The epoxy-resin moulding compound according to claim 1, wherein the hardener compound is a phenol novolak or a cresol novolak.

10. The epoxy-resin moulding compound according to claim 1, wherein the content by mass of inorganic filler is 60 to 90%.

11. The epoxy-resin moulding compound according to claim 1, wherein the content by mass of inorganic filler is 70 to 85%.

12. The epoxy-resin moulding compound according to claim 1, wherein the filler is synthetic silica.

13. The epoxy-resin moulding compound according to claim 1, wherein the reaction accelerator is a substituted imidazole or 1,8-diazabicyclo[5.4.0]undec-7-ene.

* * * * *